United States Patent [19]

Ghiraldi

[11] Patent Number: 4,921,039

[45] Date of Patent: May 1, 1990

[54] DEVICE FOR THE PROTECTION AND THERMAL CONDITIONING OF APPARATUS IN PARTICULAR ELECTRONIC APPARATUS GENERATING HEAT

[76] Inventor: Alberto Ghiraldi, Via Palatino 8, Milan 20148, Italy

[21] Appl. No.: 184,605

[22] Filed: Apr. 21, 1988

[30] Foreign Application Priority Data

Apr. 21, 1987 [IT] Italy ................................ 20190 A/87

[51] Int. Cl.[5] ........................ F28D 15/00; H01L 23/46
[52] U.S. Cl. ........................................ 165/32; 165/45; 165/104.19; 165/104.33; 165/104.34; 361/385
[58] Field of Search ................. 165/104.33, 45, 104.14, 165/104.19, 32, 104.34; 361/385

[56] References Cited

U.S. PATENT DOCUMENTS

| 854,278 | 5/1907 | Darlington | 165/104.33 |
|---|---|---|---|
| 2,181,953 | 12/1939 | Usselman | 165/46 |
| 3,168,777 | 2/1965 | Ridder et al. | 165/104.33 |
| 3,461,952 | 8/1969 | Decker et al. | 165/46 |
| 4,009,417 | 2/1977 | Waldon et al. | 361/38 |
| 4,009,418 | 2/1977 | Bennett | 165/104.33 |
| 4,044,396 | 8/1977 | Haws et al. | |
| 4,293,030 | 10/1981 | Rambach | 165/40 |
| 4,564,061 | 1/1986 | Rauth et al. | 165/45 |

FOREIGN PATENT DOCUMENTS

| 971999 | 5/1959 | Fed. Rep. of Germany . |
| 1191901 | 4/1965 | Fed. Rep. of Germany . |
| 2209938 | 9/1973 | Fed. Rep. of Germany . |
| 2638702 | 3/1978 | Fed. Rep. of Germany . |
| 2712017 | 9/1978 | Fed. Rep. of Germany . |
| 2753914 | 6/1979 | Fed. Rep. of Germany . |
| 37938 | 4/1978 | Japan ............................ 165/104.33 |
| 581420 | 10/1976 | Switzerland . |

Primary Examiner—Albert W. Davis, Jr.

[57] ABSTRACT

A device for the protection and thermal conditioning of electronic apparatus generating heat consisting of a plurality of conduits in which a thermal carrying fluid flows, disposed in a spiral array structurally independent and with lengths outside the device buried underground at a predetermined depth.

4 Claims, 2 Drawing Sheets

4,921,039

DEVICE FOR THE PROTECTION AND THERMAL CONDITIONING OF APPARATUS IN PARTICULAR ELECTRONIC APPARATUS GENERATING HEAT

BACKGROUND

The present invention refers to a device for the protection and thermal conditioning of apparatus, in particular electronic apparatus generating heat, of the type comprehensive of a box form closed structure in which is defined an ambient destined to contain electronic apparatus, and a plurality of conduits disposed in an array of loops in which a thermal carrying fluid flows, a first length of each of the said conduits extend outside the said ambient and a second length is inside the ambient.

In the field of installation of electronic apparatus, for example units that are a part of telecommunication or radar systems, and remote centers for elaborating data, it is well known of the necessity to protect this electronic apparatus against atmospheric agents and to maintain the ambient in which it is located at a temperature as near as possible constant and equal to the value established during the development of the project, and essential for the correct functioning of the apparatus over lengthy periods of time.

To satisfy the above mentioned requirements and in particular when the electronic apparatus must be installed in remote and isolated areas or anyway when the apparatus does not require normal maintenance, it is well known the use of protective devices and thermal conditioning better known as the English term "shelter". These devices generally consist of a box form structure with insulated walls to limit the thermal exchange with the outside, and the use of more or less complex systems for the removal of heat accumulated inside and produced by the dissipated power of the electronic apparatus whilst functioning and also be periodic rises in the external ambient temperature.

In particular the conventional devices use as systems of removal of heat one or more heat exchangers in which a thermal carrying fluid flows which dissipates the heat by appropriate panels located on the outside of the device. These heat exchangers are preferred to air conditioners and heat pumps as they are much more reliable and do not need maintenance or a power source as the circulation of the thermal carrying fluid is made by natural convection.

However, the conventional devices of the type indicated above have a major inconvenience in that the temperature of the internal ambient in which the electronic apparatus is installed depends to an unacceptable amount on the variations of the external ambient temperature, during the day and also over a yearly period.

The basic problem to be resolved by this invention is that of creating a device of the type specified previously for the protection and thermal conditioning of electronic apparatus which has structural and functional characteristics capable of overcoming the inconvenience mentioned above.

This problem is resolved in conformance to the invention by a device of the type specified, characterized by the fact that the said first length of the conduits are inserted in a heat reservoir of a substantially constant temperature.

Advantageously and as per invention, the heat reservoir is underground.

Additional characteristics of the device conforming to the invention can be seen from the following description of a preferred "as built" example with indicative data not limited to references in the attached drawings.

DESCRIPTION OF THE INVENTION

Figure 1:
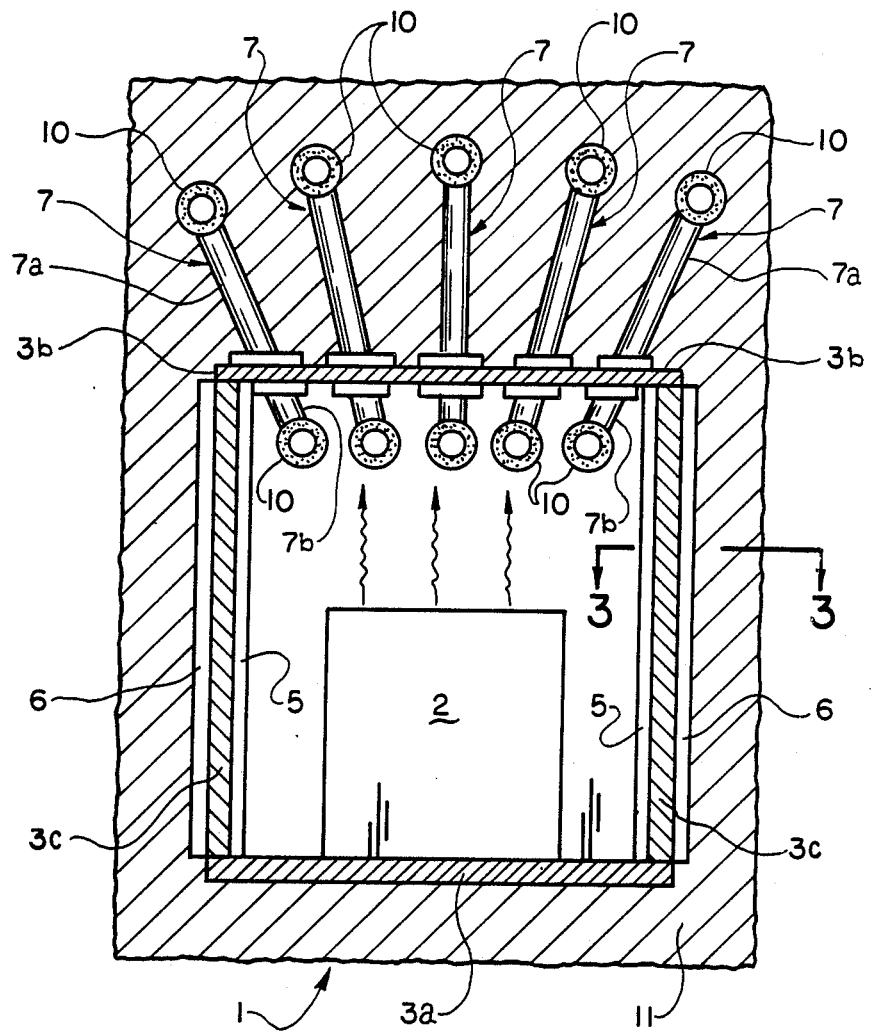
FIG. 1 is a schematic view from above of the device as per the invention for the protection and thermal conditioning of the electronic apparatus.
Figure 2:
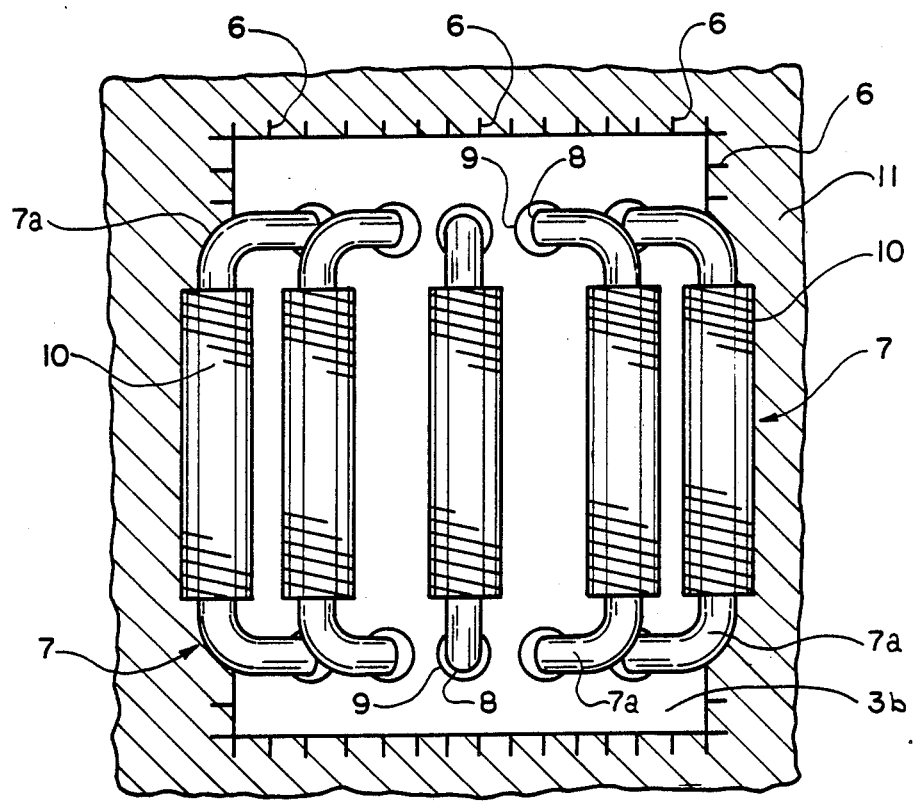
FIG. 2 is a front elevation sectional view of the device in FIG. 1.
Figure 3:
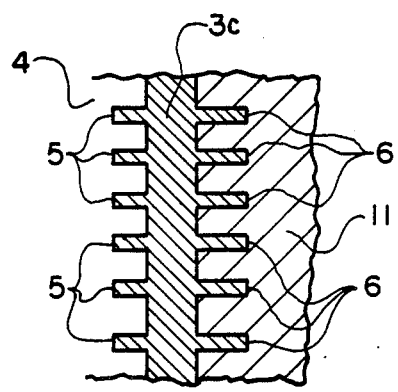
FIG. 3 is a view of a detail of the device as per the invention in section following lines III—III of FIG. 2.

With reference to the above figures, in 1 is schematically indicated a container device known as a "shelter", for the protection from atmospheric agents and for the termal conditioning of electronic apparatus 2 which in itself is conventional; in particular the electronic apparatus 2 when operating emits heat mainly in an upwards direction.

The device 1 includes a box form closed structure with a floor 3a, an opposed ceiling 3b, and lateral walls all indicated by 3c. In the box form structure is defined an internal ambient 4, adapted to contain the electronic apparatus 2.

As per the invention, the lateral walls 3c, are furnished with fins 5 and 6 which are parallel, vertical and in reciprocally related distance, extended respectively in the internal ambient 4 and to the outside of the device 1.

Furthermore, the external fins 6, have larger dimensions that the fins 5. The device 1 as per the invention, also includes as a principle means of dissipating to the outside the heat produced by the electronic apparatus 2, in the internal ambient 4, a plurality of tubular conduits 7, containing a thermal carrying fluid flowing by natural convection, the conduits 7 are shaped according to respective loops which are also indicated by ref. 7, and which are structurally individually independent, arrayed and supported by the ceiling 3b of the box form 3. In particular each spiral 7 is extended through two circular openings 8 formed in the ceiling 3b which are provided with water tight seals, so that a first length 7a of each spiral 7 is extended outside the ambient 4 and a second length 7b inside the ambient 4.

Preferably, not only the first length which is longer 7a but also the second shorter length 7b are externally furnished for a major portion of their length with fins 10 of helical form, to increase the thermal exchange surface.

As per the present invention the entire device 1, and therefore also the first length 7a of the conduits 7 are buried underground 11 at a predetermined depth, and there is foreseen conventional means and structures which are not represented in the figures for entering the internal ambient 4 of the device 1 as buried.

It should also be noted that as per the invention, having foreseen the first length 7a of the conduits 7 located at a predetermined depth in the ground and therefore in relation to their thermal exchange, is equivalent to burying this first length 7a in a heat reservoir 11 sufficiently large as to maintain at a substantially constant temperature the value of which as is well known, is practically independent of the daily variations of the external ambient temperature.

Consequently by appropriately dimensioning the conduits and fins, and chosing an adequate thermal carrying fluid, it is possible to easily obtain in the internal ambient of the device a temperature which is in turn constant and equal to that required for the optimal functioning of the electronic apparatus.

The above mentioned device described as per the present invention has the additional advantage regarding the finned conduits in which the thermal carrying fluid flows by natural convection, and therefore does not need any ordinary maintenance, and by the fact that the walls of the box form structure are also buried underground and do not call for any insulation and contribute in a major way to the removal of the heat.

I claim:

1. A device for providing thermal protection for heat generating apparatus such as electronic apparatus, comprising a box form structure defining an ambient adapted to contain heat generating apparatus and a plurality of conduits connected with said box structure, each of said conduits being substantially completely filled with a thermal carrying liquid, each of said conduits forming a continuous loop disposed such that a first length of each conduit extends outside said ambient and a second length of each conduit is disposed inside said ambient, each of said plurality of conduits being independent from the other conduits, said first length of each of said plurality of conduits being immersed in an underground heat reservoir of a substantially constant temperature, said thermal carrying liquid in each of said conduits being adapted to change density without changing phase and to circulate in the respective conduit and through said heat reservoir by natural convection in response to heat generated within said ambient, and the length of each of said conduits inside the ambient being positioned in close proximity to the ceiling of the said box form structure.

2. A device as per claim 1, characterized by the fact that the said conduit loops are positioned in an array.

3. A device as per claim 1, characterized by the fact that the first length and the second length of each of said conduit loops have external fins over a major portion of their lengths.

4. A device as per claim 1, characterized by the fact that the lateral walls of the said box structure are furnished with internal fins projecting into said ambient and external fins projecting into said heat reservoir.

* * * * *